United States Patent [19]

Omura et al.

[11] Patent Number: 4,831,253

[45] Date of Patent: May 16, 1989

[54] ROTARY TYPE PHOTOELECTRIC SWITCH

[75] Inventors: Yutaka Omura; Takesi Kikukawa, both of Izumo, Japan

[73] Assignee: Omron Tateisi Electronics Co., Kyoto, Japan

[21] Appl. No.: 82,349

[22] Filed: Aug. 6, 1987

Related U.S. Application Data

[63] Continuation-in-part of Ser. No. 15,207, Feb. 13, 1987.

[51] Int. Cl.$^4$ .............................................. G01D 5/34
[52] U.S. Cl. .................................... 250/229; 200/61.02
[58] Field of Search .................... 250/229, 239, 231 R; 200/11 J, 67 A, 67 F, 61.02

[56] References Cited

U.S. PATENT DOCUMENTS

| | | | |
|---|---|---|---|
| 2,195,295 | 3/1940 | Brown et al. | 200/67 A |
| 3,194,912 | 7/1965 | Mink | 200/67 F |
| 3,996,436 | 12/1976 | Barney | 200/67 A |
| 4,065,669 | 12/1977 | Bogel | 250/229 |
| 4,105,938 | 8/1978 | Mathews, Jr. | 318/599 |
| 4,169,981 | 10/1979 | White et al. | 250/229 |
| 4,284,885 | 8/1981 | Swensen | 250/229 |
| 4,339,662 | 7/1982 | Basch et al. | 250/229 |
| 4,349,735 | 9/1982 | Maeda | 250/229 |
| 4,471,179 | 9/1984 | Dietrich | 200/67 F |
| 4,642,432 | 2/1987 | Ring | 200/155 R |

Primary Examiner—David C. Nelms
Attorney, Agent, or Firm—Foley & Lardner, Schwartz, Jeffery, Schwaab, Mack, Blumenthal & Evans

[57] ABSTRACT

A rotary type photoelectric switch comprises a rotary shaft rotated by an external force, a light interrupting plate coupled to the rotary shaft, a light-emitting element for emitting light, and a light-receiving element for receiving the light of the light-emitting element, wherein the light interrupting plate swings to enter into and exit from the lightpath formed between the light-emitting element and the light-receiving element. A stopper remote from the rotary shaft regulates the stroke of the light-interrupting plate, and a wavy spring or magnet reduce bounce of the plate.

25 Claims, 6 Drawing Sheets

FIG. 10 and

ROTARY TYPE PHOTOELECTRIC SWITCH

CROSS-REFERENCE

This is a continuation-in-part of application Ser. No. 015,207, filed Feb. 13, 1987.

BACKGROUND OF THE INVENTION

1. Field of the Invention

This invention relates to a photoelectric switch, and more particularly to a rotary type photoelectric switch which is operated by the clockwise and counterclockwise rotation of a shaft.

2. Discussion of the Related Art

There are well known photoelectric switches which contain a light emitting element, a light receiving element, and a light interrupting element slidably provided therebetween. Referring to a conventional photoelectric switch shown in FIG. 1, a push button 1 is pressed against a return spring 2, so that a movable piece 3 pulled by a coil spring 4 acts downwardly in a snap movement. A light interrupting element 5 coupled with movable piece 3 vertically passes down such that a window 6 of the interrupting element 5 moves to the point where a light emitting from an LED 7 is received by a photo-diode 8, thus completing a switch circuit. The switch circuit is broken by releasing push button 1.

Figure 1:
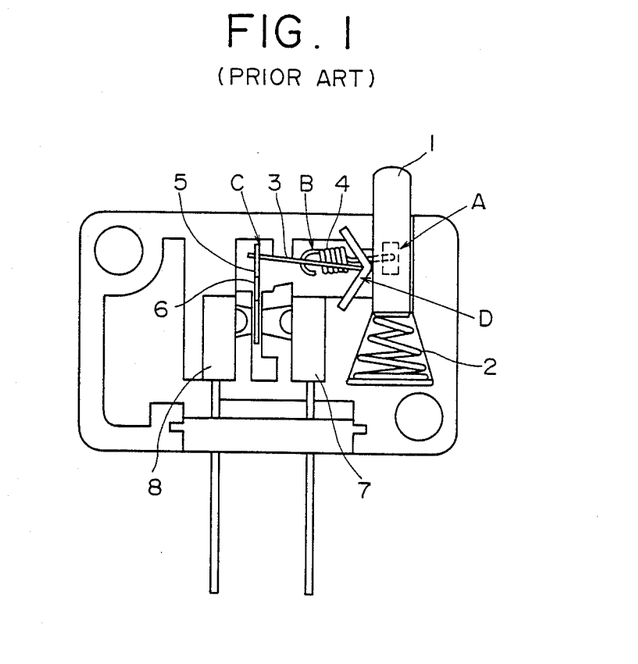
FIG. 1 is a side view showing a prior form of a photoelectric switch.

However, as denoted by A to D in FIG. 1, many pivots and connections are required to perform such a snap movement, which causes wear or abrasion of contacting parts at such connections, shortening the life of the conventional photoelectric switch.

SUMMARY OF THE INVENTION

It is an object of the present invention to provide a photoelectric switch which incorporates a rotary mechanism therein so that the number of connections and moving parts can be reduced, and the life of the switch can be extended.

Another object of the invention is the provision of stoppers for a rotary shaft which are disposed remote from the central axis of a rotary shaft so as to easily and accurately regulate the stroke range of the rotary shaft.

A further object of the invention is the provision of a coil spring the bases of which are so arranged that the spring will expand and contract in a wavy manner, thus preventing a malfunction of a switch caused by the bouncing or rebounding action of a light-interrupting plate.

An alternative object is to provide a magnet on the housing to also reduce bounce.

According to one form of the invention, there is provided a rotary type photoelectric switch comprising a rotary shaft rotated by external force, a light-interrupting plate coupled to the rotary shaft, a light-emitting element for emitting light, and a light-receiving element for receiving the light from the light-emitting element, wherein the light-interrupting plate by the rotary movement thereof enters into and exits from the lightpath formed between the light-emitting element and the light-receiving element. Finally, a wavy spring or a magnet is provided to reduce bounce.

BRIEF DESCRIPTION OF THE DRAWINGS

The above and other objects and advantages of the rotary type photoelectric switch according to the instant invention will become apparent from the following description taken together with the accompanying drawings, wherein.

DETAILED DESCRIPTION OF THE INVENTION

A first embodiment of this invention will now be described with reference to FIG. 2, FIG. 3, FIG. 4, FIG. 5 and FIG. 6.

Figure 2:
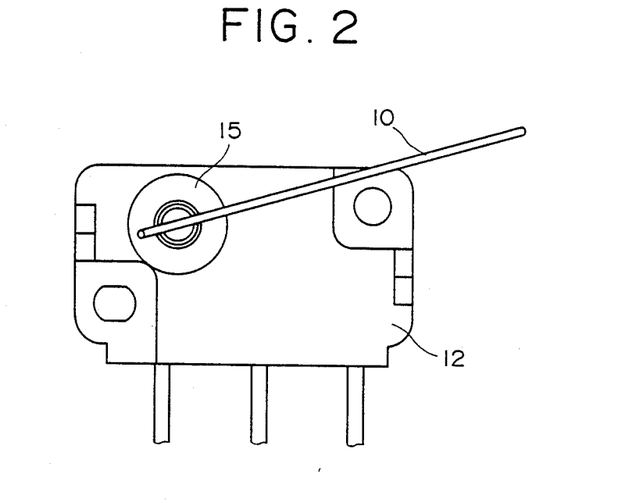
FIG. 2 is a side view showing the appearance of a rotary type photoelectric switch of the instant invention.
Figure 3:
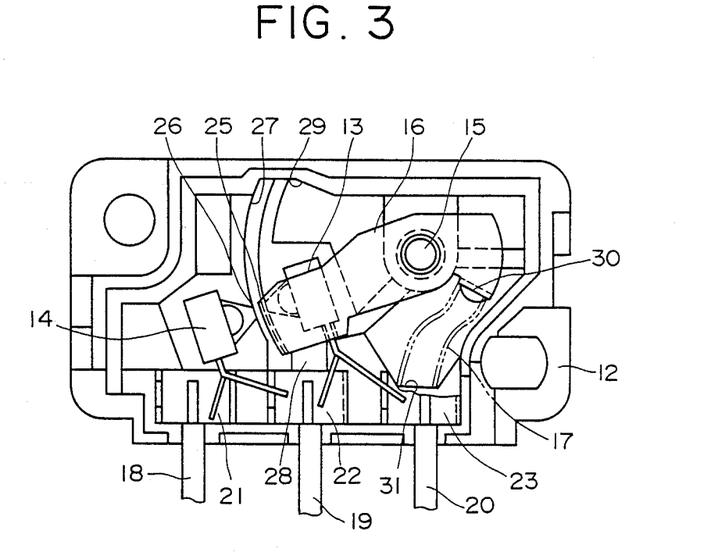
FIG. 3 is a sectional view of one form of the rotary type photoelectric switch of FIG. 2 in which the switch is in the Free position (FP)
Figure 4:
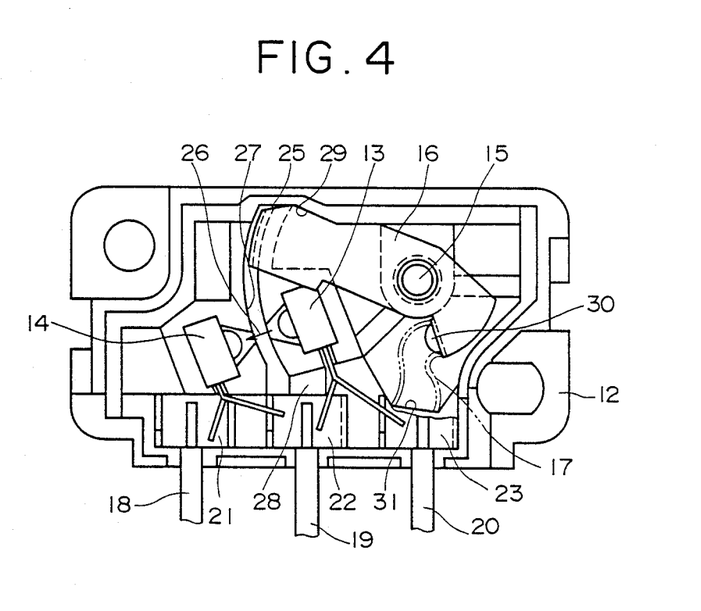
FIG. 4 is a sectional view of the rotary type photoelectric switch of FIG. 3 in which the switch is in the Total Travel Position (TTP)
Figure 5:
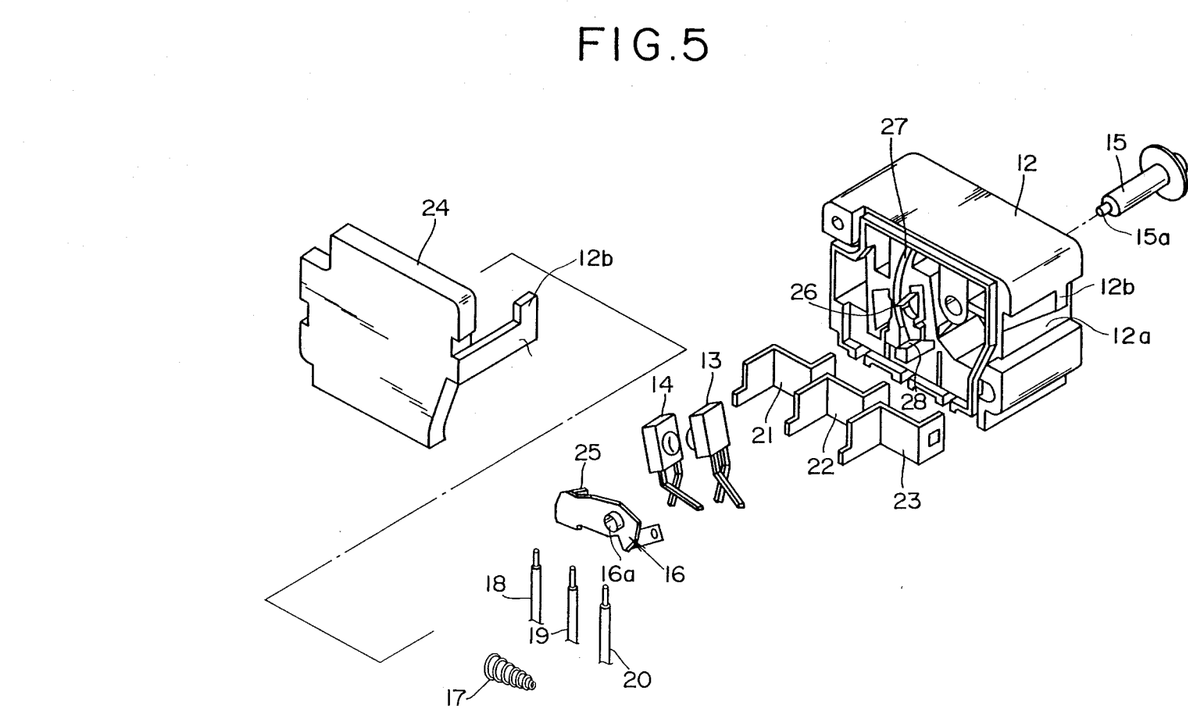
FIG. 5 is an exploded-perspective view of the rotary type photoelectric switch of FIG. 3.

FIG. 2 is a side view of a rotary type photoelectric switch according to this invention, in which a lever 10 is linked to a rotary shaft 15, the shaft being rotated by the lever 10. Referring to FIGS. 3, 4, and 5, there are shown internal components housed in a switch case 12 of the photoelectric switch. Among the components housed in switch case 12 are a light-emitting diode 13 (LED), a phototransistor 14, the rotary shaft 15, a light-interrupting plate 16 connected to rotary shaft 15, a coil spring 17 for returning light-interrupting plate 16 to its original position, a plurality of leads 18, 19 and 20, a plurality of terminals 21, 22, and 23, and a switch cover 24 which covers these components. Cover 24 has a resilient leg 24a which is designed to spring-into a recess 12a having a holding notch 12b cooperating with an upturned segment 24b on leg 24a.

One end of rotary shaft 15 extends exterior of switch case 12 and coupled to lever 10. Another end 15a of rotary shaft is fixed to light-interrupting plate 16 at 16a such that a light-interrupting portion 25 formed at the tip of plate 16 will swing together with rotary shaft 15 so as to enter into and exit from the lightpath 28 formed between LED 13 and phototransistor 14.

The light-interrupting portion 25 formed by bending the tip of light-interrupting plate 16 is slidably engaged in a circular groove 27, a portion of which is cut to provide the lightpath 26. As light-interrupting plate 16 swings, the portion 25 slides along the circular groove 27.

Normally, the photoelectric switch is in an off-state as shown in FIG. 3, wherein light-interrupting plate 16 is biased by coil spring 17 so as to be in a position wherein the light of LED 13 is prevented by light-interrupting portion 25 from reaching phototransistor 14. Coil spring 17 is pressurized between an upper spring base 30 formed at one end of light-interrupting plate 16 and a lower spring base 31 formed on switch case 12.

As light-interrupting plate 16 rotates against the spring force in response to the external force applied to lever 10, light-interrupting portion 25 rotates clockwise so that the light emitted from LED 13 is received by phototransistor 14 to bring the switch into an on-state as shown in FIG. 4.

Figure 6:
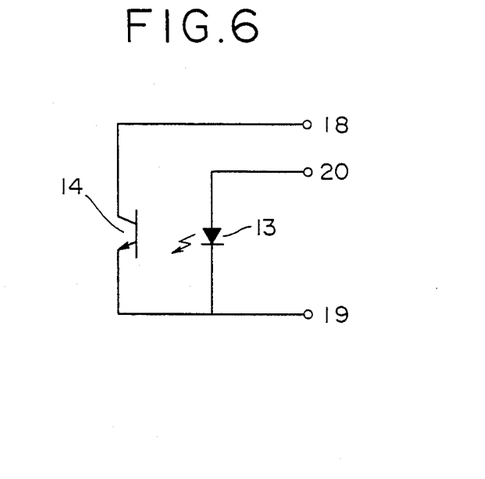
FIG. 6 is an electric circuit diagram of FIG. 2.

As shown in FIG. 6, LED 13 is electrically connected between an input lead 20 and an output lead 19, while phototransistor 14 is connected between an input lead 18 and an output lead 19. Actually, as the leads of LED 13 and phototransistor 14 are too thin to directly connect with leads 18, 19, and 20, terminals 21, 22, and 23 are provided therebetween which merely serve as relay terminals for relaying a signal from input leads 18 and 20 to the thin leads and from the thin leads to said output lead 19.

The light-interrupting plate 16 also acts as a lever for regulating the range of stroke thereof. The clockwise and counterclockwise rotation of light-interrupting plate 16 is interrupted by a stopper 28 at free position (FP) and a stopper 29 at total travel position (TP).

Stoppers 28 and 29 may be formed integrally with switch case 12. These stoppers are provided remote from rotary shaft 15 and are respectively disposed to come into contact with each side of the end of light-interrupting plate 16 close to interrupting portion 25. It should be noted that the accuracy of stroke range between FP and TTP at the position of the tip of lever 10 can be improved by providing stoppers 28 and 29 as far from the central axis of rotary shaft 15 as possible.

Referring to FIGS. 3 and 4, each end of coil spring 17 is so supported by upper spring base 30 and lower spring base 31 such that the spring 17 will "meander" or expand and contract in a wavy or non-straight line, light-interrupting plate 16 rotates in both directions. More specifically, upper spring base 30 is provided to face in a different direction with respect to the direction to which lower spring base 31 faces.

Thus, as coil spring 17 expands to rotate light-interrupting plate to its Free Position, the expansion force does not concentrate into a single direction, thereby reducing the torque of light-interrupting plate 16 around rotary shaft 15. As a result, sharp contact between light-interrupting plate 16 and FP stopper 28 does not occur so that malfunction of the photoelectric will not be caused by bouncing action of plate 16. The expansion and contraction of coil spring 17 is guided by switch case 12 and switch cover 24.

Figure 7:
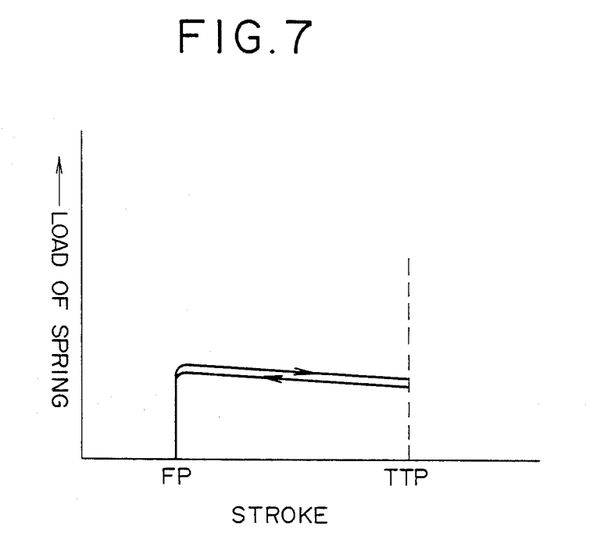
FIG. 7 is a graph illustrating the magnitude of spring load in relation to the stroke of the light-interrupting plate ranging from the Free Position to the Total Travel Position.

FIG. 7 shows the relationship between the spring load of coil spring 17 and the stroke of light-interrupting plate 16 ranging from FP to TTP. In general, the spring load increases as plate 16 comes close to TTP. In this invention, however, the spring load is kept almost constant over the range of the stroke because coil spring 17 "meanders," whereby undesirable bouncing of plate 16 can be eliminated.

Figure 8:
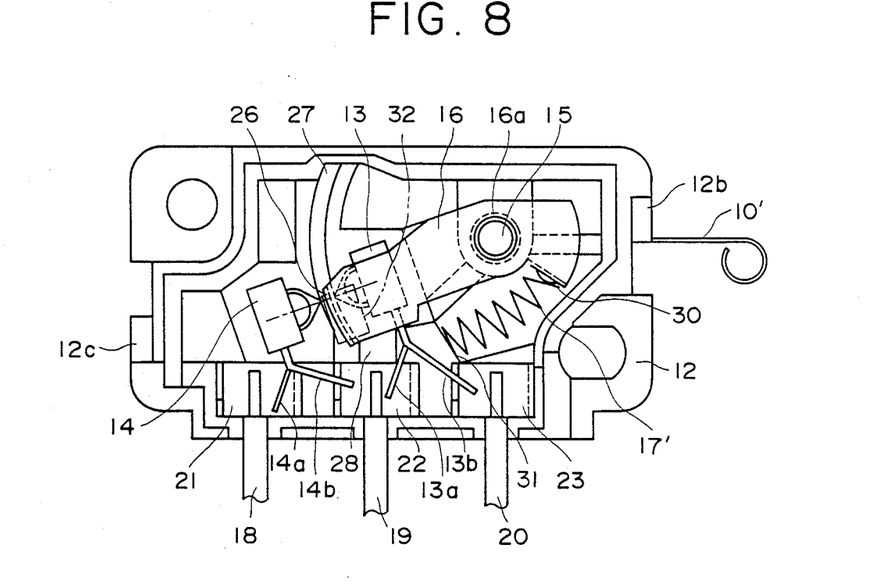
FIG. 8 is a sectional view of an alternative form of the switch shown in FIG. 2 in the Free Position.
Figure 9:
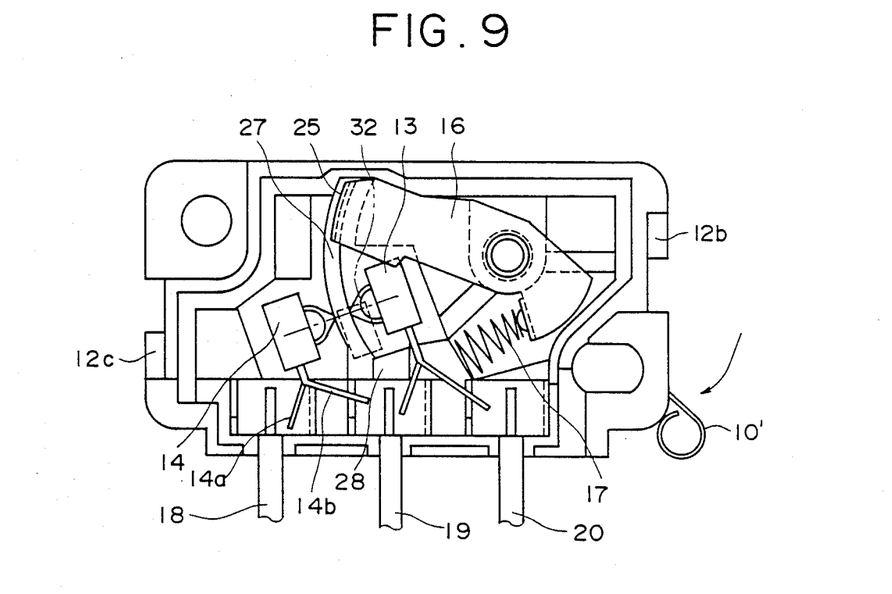
FIG. 9 is a sectional view of the switch of FIG. 8 in the Total Travel Position.
Figure 10:
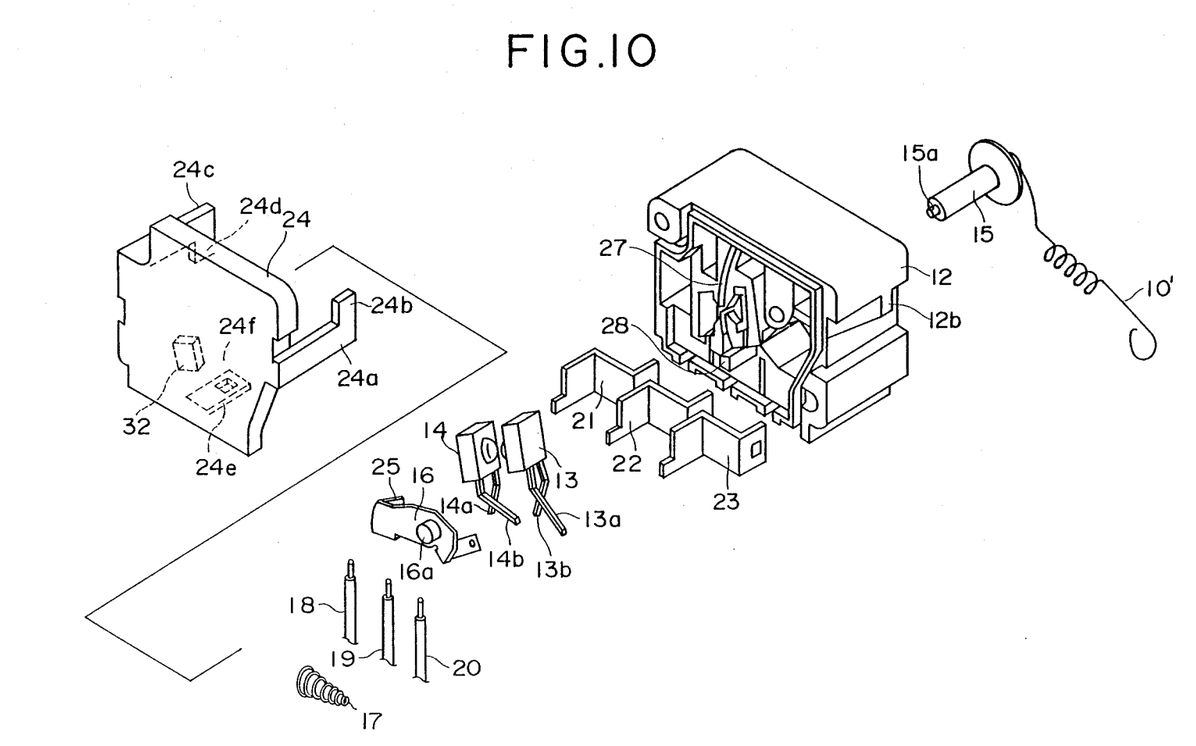
FIG. 10 is an exploded perspective view of the switch of FIG. 8.

Referring to FIGS. 8-10, an alternative embodiment is illustrated. Like numbers refer to like parts.

The cover 24 includes a second leg 24c with a downturned segment 24d cooperating with a complimentary holding notch 12c, on casing 12, the reverse of 12b. A third leg 24e has an opening 24f therein to engage a projection (not shown) on the bottom of casing 12. All legs are resilient and snap-in to complementary projections or notches on the casing 12.

Also seen mounted on the inner surface of cover 24 is a permanent magnet 32. Magnet 32 is positioned very close to FP stopper 28. The purpose of the magnet is essentially the same as spring 17 in FIGS. 3-5, thus permitting the use of a different spring 17', if desired, in FIGS. 8-10. When force is exerted on actuator/lever 10', the lever follows the arrow in FIG. 9 and moves from the position seen in FIG. 8. When force is removed from lever 2, the restoring spring 17' moves the plate 16 back from the position in FIG. 9 to that in FIG. 8. Under normal conditions the speed of the plate 16 increases as it moves close to the FIG. 8 position. Thus, bouncing can occur and yield false signals. By placing the magnet 32 close to stopper 28 in the position seen in FIG. 8, a magnetic force will be exerted on the metal plate to generally hold it in place and prevent, or at least greatly diminish, bouncing.

While several embodiments of the invention have been described, it will be understood that it is capable of further modifications, and this application is intended to cover any variations, uses, or adaptations of the invention, following in general the principles of the invention and including such departures from the present disclosure as to come within knowledge or customary practice in the art to which the invention pertains, and as may be applied to the essential features hereinbefore set forth and falling within the scope of the invention or the limits of the appended claims.

What is claimed is:

1. A rotary type photoelectric switch, comprising:
   (a) a housing,
   (b) a rotary shaft having a center in said housing rotated by an external force,
   (c) a light-interrupting plate in said housing rotatably coupled to said rotary shaft,
   (d) a light-emitting means in said housing for emitting light,
   (e) a light-receiving means in said housing for receiving the light emitted from said light-emitting means, said light-interrupting plate swinging into and exiting from a light-path formed between said light-emitting means and said light-receiving means, and
   (f) a non-linear, meandering coil spring means positioned in said housing between a base portion of said light-interrupting plate and a base portion of said housing for maintaining a substantially constant spring load, therein substantially eliminating undesirable rebouncing of said light-interrupting plate.

2. The rotary type photoelectric switch according to claim 1, further comprising a pair of stopper means for regulating the rotation of said rotary shaft within a predetermined range, said stopper means being disposed apart from the center of said rotary shaft for easily and accurately adjusting a stroke range of said rotary shaft by contacting said light-interrupting plate at extreme positions of movement.

3. The rotary type photoelectric switch according to claim 2, wherein said stopper means contacts a tip of said light interrupting plate.

4. The rotary type photoelectric switch according to claim 1 wherein said non-linear, meandering coil spring means has two bases for urging said light-interrupting plate to an extreme position, each base of said spring means being so arranged that said spring means will expand in a non-straight line to exert a spring force on a surface substantially parallel to a rotation surface said light-interrupting plate.

5. A rotary type photoelectric switch according to claim 1, wherein said non-linear coil spring means has two bases, and wherein one of said bases is disposed to face in a direction away fro the direction in which the other base faces.

6. The rotary type photoelectric switch according to claim 1, said housing including a cover and resilient legs joining said over onto said housing.

7. The switch of claim 5 including a shaft for rotating said light interrupting means and wherein said adjusting means is a stopper positioned remote from said shaft.

8. The switch of claim 4 wherein said bounce reducing means comprises a coil spring means positioned between a portion of a housing containing said light interrupting means and said light interrupting means.

9. A photoelectric switch comprising:
(a) means for emitting light,
(b) means for receiving light from said light emitting means,
(c) means for interrupting light between said light emitting means and said light receiving means said light interrupting means being movable between a light blocking and a light receiving position, and
(d) a non-linear, meandering coil spring means operably connected to maintain a substantially constant spring load between said light interrupting means and a housing for reducing bounce of said light interrupting means.

10. The switch of claim 9 including means for rotating said light interrupting means, and means for adjusting a stroke of said light interrupting means.

11. The photoelectric switch of claim 9 wherein said non-linear, meandering coil spring means has two bases for urging said light interrupting means to an extreme position, each said base being arranged so that said spring means will expand in a non-straight line to exert a spring force on a surface substantially parallel to a rotation surface of said light interrupting means.

12. A photoelectric switch comprising:
(a) means for emitting light;
(b) means for receiving light from said light emitting means;
(c) means for interrupting light between said light emitting means and said light receiving means said light interrupting means being moveable between a light blocking and light receiving position;
(d) means for reducing bounce of said light interrupting means, said bounce reducing means comprising;
a stationary magnet positioned adjacent said light interrupting means when in the light blocking position.

13. A rotary type photoelectric switch, comprising:
(a) a housing;
(b) a rotary shaft having a center on said housing rotated by an external force;
(c) a light-interrupting plate in said housing coupled to said rotating shaft;
(d) a light emitting means in said housing for emitting light;
(e) a light receiving means in said housing for receiving light emitted from said light emitting means, said light-interrupting plate having a light interrupting surface extending perpendicular from said plate swinging into and exiting from a lightpath formed between said light emitting means and said light receiving means; and
(f) stationary magnetic means located near a stopper for reducing bounce of said plate by attracting said plate into one of a light blocking position and light receiving position.

14. The rotary type photoelectric switch of claim 13 comprising a coil spring means positioned in said housing between a base portion of said light interrupting plate and a base portion of said housing, said spring means being compressed in a first extreme position and expanded in a second extreme position.

15. The rotary type photoelectric switch of claim 13 wherein said stationary magnetic means is located on an inner face of said housing.

16. The rotary type photoelectric switch of claim 13 wherein said stationary magnetic means is in a plane substantially parallel to said plate.

17. The rotary type photoelectric switch of claim 13 further comprising a pair of stopper means for regulating the rotation of said rotary shaft within a predetermined range, said stopper means being disposed remote apart from the center of said rotary shaft for easily and accurately adjusting a stroke range of said rotary shaft by contacting said light interrupting plate at extreme positions of movement.

18. A photoelectric switch comprising:
means for emitting light;
means for receiving light;
means for interrupting a lightpath formed between said light emitting means and said light receiving means, said light interrupting means operably coupled to a means for moving said light interrupting means between a light blocking position and a light receiving position;
means for restoring said light interrupting means to one of said light blocking and light receiving positions in response to release of said moving means;
means for reducing bounce of said light interrupting means when restored to one of said positions by said light restoring means.

19. The apparatus of claim 18 wherein said restoring means and said bounce reducing means comprises a non-linear, meandering coil spring means positioned between a base portion of said light interrupting means and a base portion of a housing for maintaining a substantially constant spring load, thereby substantially eliminating undesirable rebouncing of said light-interrupting means.

20. The apparatus of claim 18 wherein said restoring means comprises a coil spring means positioned between said light interrupting means and a base portion of a housing and said bounce reducing means is a stationary magnet located adjacent a stopper at one of said positions.

21. The apparatus of claim 19 wherein said non-linear, meandering spring means has two bases for urging said light interrupting plate to one of said positions, each said base being so arranged that said spring means will expand in a non-straight line to exert a spring force on a surface substantially parallel to a rotation surface of said light interrupting means.

22. A method of reducing bounce in a photoelectric switch comprising the steps of:
coupling a light interrupting means to a control means;
coupling a non-linear, meandering coil spring means between a base position of a housing and a base portion of said light interrupting means to maintain a substantially constant spring load thereon; and moving said light interrupting means with said control means between a light blocking position and a light receiving position through a lightpath formed between a light emitting means and a light receiving means in said housing.

23. The method of claim 22 comprising arranging said spring means to expand in a non-straight line and to exert a force on a surface substantially parallel to a rotation surface of said light interrupting means.

24. A method of reducing bounce in a photoelectric switch comprising the steps of:

coupling a light interrupting plate to a control means;

locating a stationary magnetic means near a stopper to reduce bounce of said light interrupting means by attracting said light interrupting means into a light blocking position;

moving said light interrupting means with said control means between a light blocking position and a light receiving position through a lightpath formed between a light emitting means and a light receiving means in said housing.

25. The method of claim 24 comprising:

operably coupling a coil spring means between a portion of said light interrupting means and a base of said housing.

* * * * *